US010685819B2

(12) United States Patent
Gopalan et al.

(10) Patent No.: US 10,685,819 B2
(45) Date of Patent: Jun. 16, 2020

(54) MEASURING CONCENTRATIONS OF RADICALS IN SEMICONDUCTOR PROCESSING

(71) Applicant: Applied Materials, Inc., Santa Clara, CA (US)

(72) Inventors: Ramesh Gopalan, Fremont, CA (US); Tom K. Cho, Los Altos, CA (US); George Alajajian, Fremont, CA (US); Michael J. Mark, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 37 days.

(21) Appl. No.: 15/975,576

(22) Filed: May 9, 2018

(65) Prior Publication Data

US 2018/0342377 A1 Nov. 29, 2018

Related U.S. Application Data

(60) Provisional application No. 62/511,198, filed on May 25, 2017.

(51) Int. Cl.
*H01J 37/32* (2006.01)
*G01N 21/31* (2006.01)
(Continued)

(52) U.S. Cl.
CPC ........ *H01J 37/32972* (2013.01); *G01N 21/31* (2013.01); *G01N 21/62* (2013.01);
(Continued)

(58) Field of Classification Search
CPC ................................................ H01J 37/32972
(Continued)

(56) References Cited

U.S. PATENT DOCUMENTS

| 5,608,526 A | * | 3/1997 | Piwonka-Corle | .... G01N 21/211 356/369 |
| 2004/0259234 A1 | * | 12/2004 | Chou | ...................... G01J 3/443 435/287.1 |

(Continued)

FOREIGN PATENT DOCUMENTS

JP          H07-221148 A        8/1995

OTHER PUBLICATIONS

PCT Notification of Transmittal of the International Search Report and the Written Opinion of the International Searching Authority for International Application No. PCT/US2018/031886; dated Nov. 13, 2018; 14 total pages.

*Primary Examiner* — Tarifur R Chowdhury
*Assistant Examiner* — Omar H Nixon
(74) *Attorney, Agent, or Firm* — Patterson + Sheridan, LLP

(57) ABSTRACT

An apparatus includes a reactive species source, a spectral measurement volume, a light source to emit a light beam into the spectral measurement volume, a spectrometer to receive the light beam from the spectral measurement volume. The apparatus includes an a controller configured to, when a reactive species is present in the spectral measurement volume, control the light source to emit the light beam into the spectral measurement volume and the spectrometer to determine an environment spectrum using the light beam, and when the reactive species is not present in the spectral measurement volume, control the light source to emit the light beam into the spectral measurement volume and the spectrometer to determine a baseline spectrum using the light beam, calculate a net spectrum based on a difference between the environment spectrum and the baseline spectrum, and estimate a concentration of the reactive species based on the net spectrum.

20 Claims, 10 Drawing Sheets

(51) Int. Cl.
*G01N 21/64* (2006.01)
*G01N 21/85* (2006.01)
*G01N 21/62* (2006.01)
*G01N 21/84* (2006.01)
*H01L 21/67* (2006.01)
*H01L 21/66* (2006.01)
G01N 21/03 (2006.01)
G01N 21/17 (2006.01)

(52) U.S. Cl.
CPC ............ *G01N 21/64* (2013.01); *G01N 21/84* (2013.01); *G01N 21/85* (2013.01); *H01L 21/67063* (2013.01); *H01L 22/10* (2013.01); *G01N 21/031* (2013.01); *G01N 2021/1734* (2013.01); *G01N 2021/8411* (2013.01)

(58) Field of Classification Search
USPC ........................................................ 356/300
See application file for complete search history.

(56) References Cited

U.S. PATENT DOCUMENTS

| | | |
|---|---|---|
| 2008/0003702 A1 | 1/2008 | Cruse et al. |
| 2009/0180113 A1 | 7/2009 | Monkowski et al. |
| 2012/0170039 A1 | 7/2012 | Venugopal et al. |
| 2012/0182622 A1* | 7/2012 | Takata ................ C03B 19/1453 359/639 |
| 2013/0003045 A1 | 1/2013 | Wilkins |
| 2013/0209666 A1 | 8/2013 | Kamada et al. |
| 2016/0345820 A1* | 12/2016 | Frisken ................ A61B 3/0025 |
| 2017/0263511 A1* | 9/2017 | Tedeschi ................ H01L 22/26 |

* cited by examiner

MEASURING CONCENTRATIONS OF RADICALS IN SEMICONDUCTOR PROCESSING

CROSS-REFERENCE TO RELATED APPLICATIONS

This application claims benefit of U.S. Provisional Patent Application Ser. No. 62/511,198, filed May 25, 2017, which is herein incorporated by reference.

BACKGROUND

Field

Embodiments of the present invention generally relate to semiconductor processing methods and systems. Embodiments more specifically relate to methods and apparatus for determining concentrations of chemically reactive gas species or radical gases utilized in semiconductor processing.

Description of the Related Art

Process chambers for semiconductors include or are operationally coupled to sources providing chemically reactive species and ions. Remote plasma sources (RPS), are a common example of such a reactive species source. Like other semiconductor processing equipment, RPS generally use electrons energized by radio frequency (RF) energy to produce excitation in gases such as $CF_4$, $NF_3$, or $O_2$ to produce radical gas that provide cleaning of silicon or carbon based deposits in process chambers. Nitrogen-containing radical gas such as NH-derived from ammonia may be used for chemical vapor deposition, including flowable chemical vapor deposition (CVD) of films such as silicon nitride and silicon oxide. More recently, selective removal processing (SRP) systems may use neutral radical gas, such as fluorine atoms, to remove silicon with high selectivity relative to other films such as silicon oxide or nitride. In other processes, such as reactive ion or dry etching, it is the neutral radical gas provided from fluorocarbon $C_xF_y$ fragments for example, which determine feature profile geometries and critical dimensions.

In RPS systems, performance in deposition rate and cleaning efficiency can vary significantly through a maintenance cycle, even under constant conditions, including gas flow rates, powers, and refurbished chambers. Such variations are generally assumed to be the effect of recombination of radical gass and other interaction on changing chamber surface conditions, resulting in changes to radical concentrations, such as free fluorine, hydrogen or oxygen atoms or fluorocarbon fragments $C_xF_y$, which affect process performance. This presents a challenge for high volume semiconductor manufacturing where such process variability increases costs to produce chips with consistent performance.

Optical emission spectroscopy (OES) has been used to measure or diagnose the presence and/or concentration of reactive ions or molecules in semiconductor processing tools has been through use of. This method may be limited in that it only measures species that are optically active. Even though thermodynamic equilibrium requires detailed balance between emission and absorption of light, most artificial plasmas in processing reactors are operating far from equilibrium and many critical radical species are not ionized or emitting light, and cannot be observed through OES.

Optical absorption spectroscopy (OAS) has been used to observe chemical species in laboratory and astronomical situations by comparing a baseline spectrum from a reference light source with a similar spectrum measured after being subject to absorption by an intervening medium or absorbing environment. See, e.g., G. Herzberg, Molecular Spectra and Molecular Structure, Vols I-IV, Krieger, 1989. In OAS, differences between the reference spectrum and the spectrum after absorbance can be very small, particularly at low concentrations or pressures. It has been difficult to ensure that varying conditions for detecting the baseline and the absorption spectrum do not mask the typically small, subtle differences between the spectra so that the differences can be used reliably to represent differences in concentration of species. For example, even recently in laboratory environments, absorbances of the order of $10^{-3}$ (i.e., 0.1%) have been reported for inductively coupled plasmas of $Cl_2$ and $O_2$, with the abundances of the reactive species, such as Cl—O, in the $10^{13}$ per $cm^3$ range. See Booth et al, *High sensitivity ultra-broad-band absorption spectroscopy of inductively coupled chlorine plasma*, Plasma Sources Science and Technology, Volume 25, Issue 3, article id. 035019 (2016).

Precise and accurate determination of concentrations of reactive species in semiconductor reactor environments is being increasingly used for process control in new semiconductor processes as dimensions of semiconductor devices continue to decline. Accordingly, there is a need for new ways to measure concentrations of chemically reactive gas species in semiconductor processing technologies.

SUMMARY

The present disclosure provides methods and apparatus for determining concentrations of chemically reactive gas species or radical gases utilized in semiconductor processing.

In one aspect, an apparatus includes a reactive species source, a spectral measurement volume fluidly coupled to the reactive species source, a light source optically coupled to the spectral measurement volume to emit a light beam into the spectral measurement volume, a spectrometer optically coupled to the spectral measurement volume to receive the light beam from the spectral measurement volume. The apparatus includes an a controller configured to, when a reactive species is present in the spectral measurement volume, control the light source to emit the light beam into the spectral measurement volume and the spectrometer to determine an environment spectrum using the received light beam, when the reactive species is not present in the spectral measurement volume, control the light source to emit the light beam into the spectral measurement volume and the spectrometer to determine a baseline spectrum using the received light beam, calculate a net spectrum based on a difference between the environment spectrum and the baseline spectrum, and estimate a concentration of the reactive species based on the net spectrum.

In another aspect, an apparatus includes a reactive species source; a spectral measurement volume fluidly coupled to the reactive species source, a light source optically coupled to the spectral measurement volume to emit a light beam into the spectral measurement volume. The apparatus further includes a beam splitter optically coupled to the light source to split the beam light into a probe light beam to be transmitted through the spectral measurement volume, and a reference light beam to be transmitted around the spectral measurement volume. The apparatus also includes a spectrometer optically coupled to the spectral measurement volume to concurrently receive the probe light beam to generate an environment spectrum and the reference light beam to generate a baseline spectrum, and a controller configured to calculate a net spectrum based on a difference between the environment spectrum and the baseline spectrum, and estimate a concentration of a reactive species based on the net spectrum.

Other methods described herein include obtaining a baseline or reference of spectrum of the broadband light source to be compared with the spectrum of said light source as absorbed by the reactive species in the semiconductor processing volume or environment.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The Beer-Lambert law of absorption, $I=I_0 e^{-\mu x}$, relates the reduced intensity of light I after absorption in a medium to the original intensity $I_0$. Here the linear attenuation coefficient $\mu$ is equal to $n\sigma$ where n is the concentration of absorbing species and $\sigma$ is the absorption cross-section, providing the relation between measured absorption and the relative concentration of absorbing radical species. To determine absolute concentrations, the absorption cross-section must be determined independently by calibration to a known absolute concentration. As an example, for an absorbing gas species at a pressure of 1 Torr, where the concentration is about $3 \times 10^{16}$ cm$^{-3}$, if the absorbing species has a absorption cross-section of $\sigma=10^{-17}$ cm$^2$, over an absorption length of about 35 cm (about the dimension of a typical semiconductor processing volume) the reduced intensity due to absorption would be about 1/e, or a reduction of about 67%. The absorption cross-section of most stable molecular species, for example absorption of light wavelengths near 200 nm by oxygen molecules, also known as the "Hertzberg continuum," is much smaller, for example around $10^{-21}$ cm$^2$, indicating that spectral differences due to absorption of such species in a typical semiconductor processing environment could be on the order of $10^{-3}$, or 0.1%. It is expected that absorbance effects of 0.01%-1% need to be measured reliably for OAS in semiconductor applications.

Generally, the strength of emission or absorption by optically active molecular species is related to the oscillator strength—the magnitude of the interaction of the electric dipole in the molecule or atom with an external electromagnetic field. The higher this oscillator strength, the higher the resulting absorption cross-section. Although stable molecules, such as oxygen, have a very small absorption cross section, more complex molecular fragments, particularly non-linear polyatomic molecules, can present higher oscillator strength and hence absorption cross-section.

Figure 1:
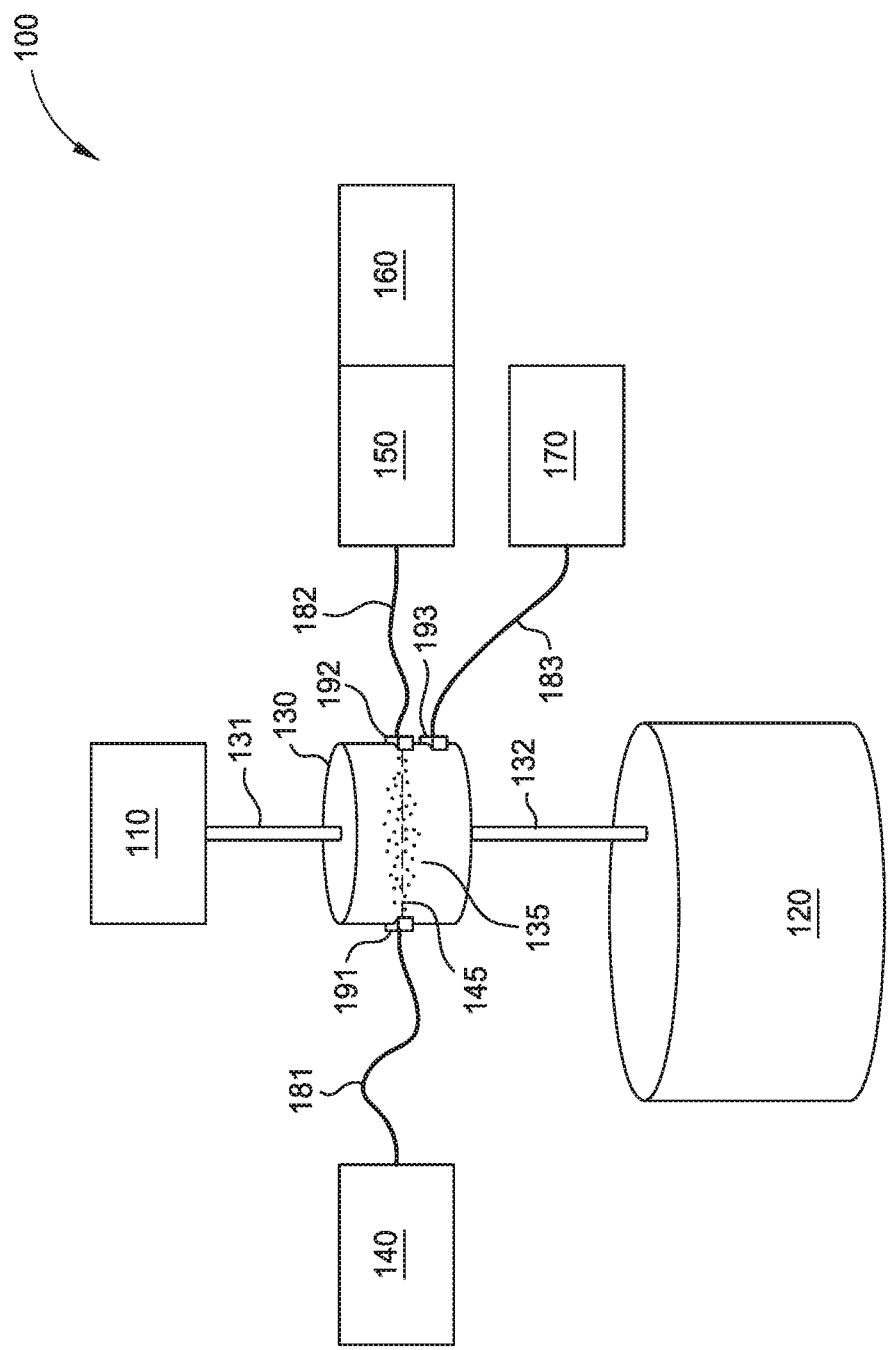
FIG. 1 illustrates a schematic diagram of an exemplary semiconductor processing system utilizing a schematic optical absorption spectroscopy (OAS) according to embodiments disclosed herein.

Described herein are methods and apparatus for performing OAS in semiconductor process chambers. FIG. 1 illustrates a system 100 for semiconductor processing utilizing OAS. The semiconductor processing system 100 generally includes a reactive species source 110 (e.g., a remote plasma source) and a chamber 120. The reactive species source 110 may be a source of reactive gas. In some embodiments, the reactive species source 110 may excite source gas with radio frequency power (e.g., 400 kHz). Ultraviolet and microwave radiation are also used.

An example reactive species source 110 may be a Revolution® or ASTRON® Remote Plasma Source available from MKS Instruments, Inc. of Wilmington, Mass. The reactive species source 110 is generally used to form ionized gas and radical gas from a molecular gas or gas mixture. For example, the reactive species source 110 can turn $NF_3$ into nitrogen and fluorine containing reactive species and/or nitrogen and fluorine atoms. In some embodiments, the reactive gas may include $NF_3$, $NH_3$, $C_xF_y$, and oxygen. Other useful reactive species might include F, $F_2$, HF, $H_2O$, NH, and ClO.

The chamber 120 may be a semiconductor process chamber. In one embodiment, the chamber 120 may include a chamber body and a substrate support disposed within the chamber body. The chamber 120 also includes a showerhead to process gas such as chemically reactive gas.

In some embodiments, the chamber 120 may be configured for vapor deposition and/or selective removal of layers on a silicon wafer. An example chamber 120 includes a Producer® Selectra™ Etch system obtainable from Applied Materials, Inc. of Santa Clara, Calif. The apparatus and methods described herein can be used in any semiconductor processing chamber where monitoring reactive species would be helpful.

The reactive species source 110 is fluidly coupled to the chamber 120 via a conduit 130. Gas travels from reactive species source 110 to chamber 120 through conduit 130. In some embodiments, reactive species source 110 is directly connected to conduit 130, while in the illustrated embodiment, reactive species source 110 is connected to channel 131 which is connected to conduit 130. In some embodiments, conduit 130 is directly connected to chamber 120, while in the illustrated embodiment, conduit 130 is connected to channel 132 which is connected to chamber 120. Other configurations may be envisioned to deliver gas from reactive species source 110, through conduit 130, and ultimately to chamber 120. In some embodiments, the conduit 130 may be lined or coated with a material resistant to chemical attack. For example, in systems that use activated oxygen species, the conduit 130 may be lined or coated with quartz. For systems that use reactive fluorine or chlorine, internal chamber parts exposed to the reactive species may be coated with resistant materials, such as yttria, while components participating in transmission or total internal reflection of light may be made of sapphire. In general, the conduit 130 is shaped to minimize loss of reactive species as the gas flows from the reactive species source 110 to the chamber 120.

In general semiconductor processing involves several steps, each step having duration of several seconds to several minutes. The transit time of reactive species through the processing volume (and through the spectral measurement volume) is usually much less, and can be determined from the total gas flows (typically a few standard liters per min) and operating pressures (typically 10 mTorr-10 Torr). In chambers having volumes of 1-100 L, this residence time is of order 100 milliseconds or less. The lifetime of the chemically unstable species of interest is of the same, or smaller, order, for example a few tens of milliseconds.

Semiconductor processing system 100 may be configured for OAS. Semiconductor processing system 100 therefore may include the conduit 130 having a spectral measurement volume 135, a broadband light source 140 (BLS), and a spectrometer 150. For example, conduit 130 may be optically coupled to BLS 140 and spectrometer 150. BLS 140 may define an optical axis 145 through spectral measurement volume 135. In one embodiment, a BLS supplied by Hamamatsu® (previously Energetiq®) of Woburn, Mass., can be used. In many cases, the BLS has features to minimize variation of light spectral intensity during the duration of measurement, particularly at the UV wavelengths below 400 nm where many critical absorption lines are observable. In the embodiments described herein, light sources and spectrometers that are capable of making meaningful spectral measurements in a light collection duration less than 100 ms, which is about the residence time and/or lifetime of reactive species of interest. In some cases, spectrometers having light integration time on a CCD sensor that is about 100 msec or less are used to obtain repeatable measurements of absorbances of 0.1% or less.

Spectrometer 150 may be aligned on the optical axis 145. For example, during OAS, light from BLS 140 may be received by the spectrometer 150 after partial absorption by reactive species in spectral measurement volume 135.

The BLS 140 produces light with wavelengths in the range of about 150 nm to about 5000 nm. In some embodiments, BLS 140 may produce light with wavelengths in the near UV range of about 150 nm to about 200 nm. In some embodiments, BLS 140 may produce light with wavelengths in the visible range of about 200 nm to about 800 nm. In some embodiments, BLS 140 may produce light with wavelengths in the IR range of about 800 nm to about 5000 nm.

The BLS 140 may be selected based on the expected reactive species from reactive species source 110, and/or the reactive species source may be selected based on the expected type of light from BLS 140. For example, BLS 140 and reactive species source 110 may be selected so that a spectral intensity of any radiation (e.g, emission) emitted by the reactive species is less than a spectral intensity of light emitted by the broadband light source. Absorption at a given wavelength can be determined by comparing radiation intensity at the wavelength detected by the spectrometer 150 to radiation intensity at the wavelength emitted by the BLS 140. If reactive species in the processing volume emit radiation at the wavelength of interest, those emissions will confound determination of the absorption. Thus, if a ratio of intensity emitted by the BLS 140 to ratio of intensity emitted by reactive species in the processing volume is much greater than 1, for example 100 or more, any contribution by reactive species in the processing volume to radiation intensity received by the spectrometer 150 will be negligible.

In some embodiments, BLS 140 may be any one of a Xenon arc lamp, a metal halogen light source, and/or a deuterium lamp, and/or a laser-driven light source. In some embodiments, a stabilized discharge light source is used to provide intense broadband radiation with minimal intensity variation. An example of a light source that may be used is any of the EQ-99X light sources available from Energetiq® Technology, Inc., of Woburn, Mass. Other light sources having relatively low variation in intensity, for example less than about 10% in 10 minutes, or less than about 1% in 1 minute, may be used as light sources. Alternately, or additionally, variation in the output intensity of the BLS 140 may be measured directly, and the measurement may be used to adjust the intensity measured by the spectrometer 150 to remove variation due to the BLS 140 itself, as described further below.

As illustrated, BLS 140 is optically coupled to conduit 130 through an optical guide 181 (e.g., one or more optical fibers) and an optical viewport 191 (e.g., a glass, quartz, or sapphire window or lens). Other configurations may be used to operationally connect BLS 140 to conduit 130. Likewise, as illustrated, spectrometer 150 is optically coupled to conduit 130 through an optical viewport 192 and an optical guide 182. Each of the optical viewports 191 and 192 include an opening formed in a sidewall of the conduit 130. The BLS 140 and optical guide 182 are arranged such that an optical axis of the BLS 140 and an optical axis of the optical guide 182 are oriented through the respective openings and optically couple the BLS 140 and the optical guide 182 together.

Each optical viewport 191 and 192 may include a window. In the case that the optical viewport 191 includes a window, the window may be positioned against the sidewall of the conduit 130, outside or inside the conduit 130. The BLS 140 and/or an end of the optical guide 182 may be embedded in the window to provide optimal optical coupling through the material of the window into the interior of the conduit 130. The window may be made of a material resistant to chemical attack, or otherwise compatible with gases in the conduit 130. In another embodiment, one or more of the BLS 140 and the end of the optical guide 182 may protrude through the opening into the conduit 130, and the window may be disposed around the portion of each protruding into the conduit 130 to prevent attack by process chemicals. The window may be sealed to the sidewall of the conduit by any suitable means, such as for example use of a compliant sealing member disposed between the window and the sidewall of the conduit. Anti-reflective coatings may be used on any optical surfaces of the BLS 140, optical viewports 191 and 192, and optical guide 182.

In some embodiments, semiconductor processing system 100 may also include a sensor array 160 (e.g., one or more charged-couple device ("CCD") sensors and/or photodetectors) and/or a fluorescence detector 170. For example, spectrometer 150 may be operationally connected to conduit 130 and sensor array 160. In some embodiments, conduit 130 may also be operationally connected to a fluorescence detector 170. As illustrated, fluorescence detector 170 is optically coupled to conduit 130 through an optical viewport 193 and an optical guide 183. Other configurations may be considered to operationally connect spectrometer 150 to conduit 130.

Figure 2:
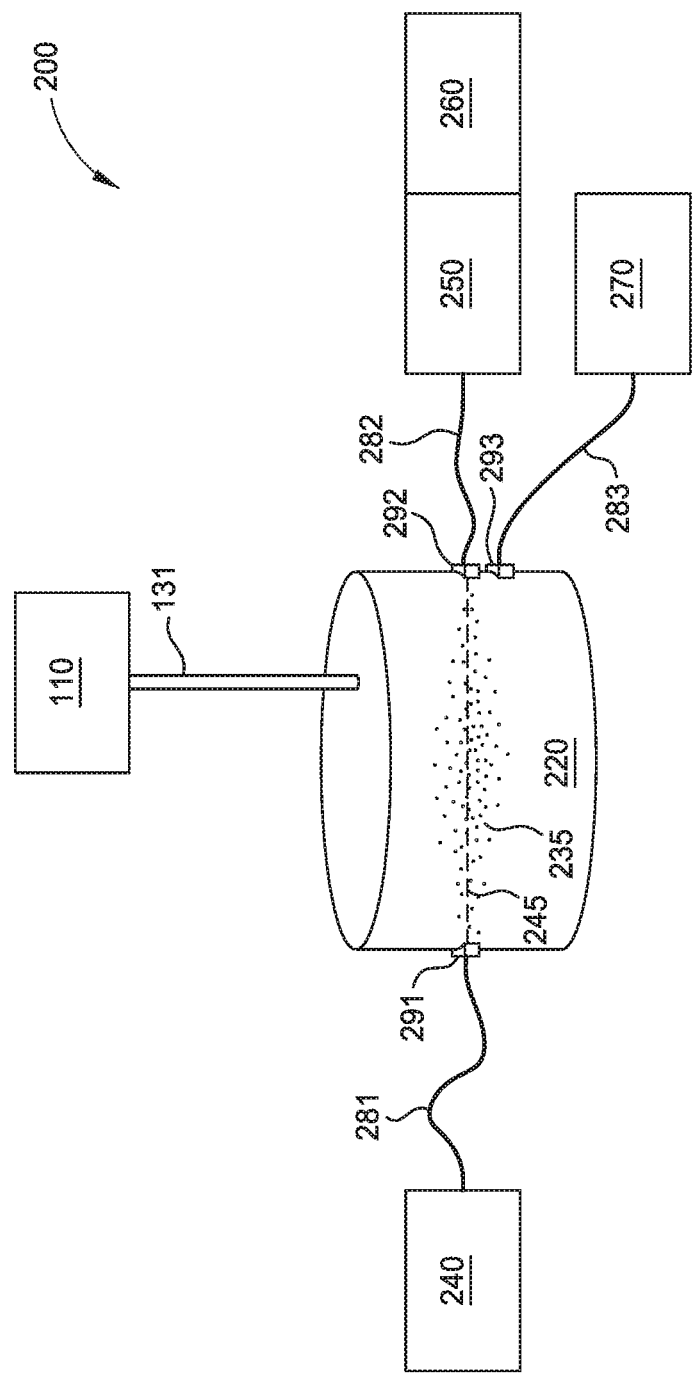
FIG. 2 illustrates a schematic diagram of another exemplary semiconductor processing system utilizing the OAS according to embodiments disclosed herein.

In some embodiments, rather than utilizing conduit 130, OAS measurements may be done within the process chamber. For example, as illustrated in FIG. 2, a semiconductor processing system 200 may be configured similarly to semiconductor processing system 100, but lacking the conduit 130. BLS 240 may be optically coupled to chamber 220 by optical guide 281 and viewport 291, thereby defining an optical axis 245. The optical axis 245 is oriented through the spectral measurement volume 235, which in this case is located within the chamber 220.

Spectrometer 250 and/or fluorescence detector 270 are optically coupled to the spectral measurement volume 235 within the chamber 220. Spectrometer 250 is optically coupled to the spectral measurement volume 235 by optical guide 282 and viewport 292, while fluorescence detector 270 is optically coupled to the spectral measurement volume 235 by optical guide 283 and viewport 293. The spectral measurement volume 235 may be located at any suitable location in the chamber 220. For example, the optical axis 245 may be close to a substrate processing position of the chamber 220, such as within about 1 mm of the surface of a substrate disposed in the chamber 220 for processing. As another example, the optical axis 245 may be located inside a gas distribution assembly of the chamber 220.

If the chamber 220 has a showerhead-type gas distributor with an internal plenum for uniform gas distribution, the optical axis may be located inside the plenum of the gas distributor. In another embodiment, the optical axis 245 may be located in an exhaust portion of the chamber 220, such as a foreline. It should be noted that the optical axis 245 is shown substantially parallel to a basis plane, for example a substrate processing plane, of the chamber, but in other embodiments the optical axis 245 may be non-parallel with the basis plane.

Figure 3:
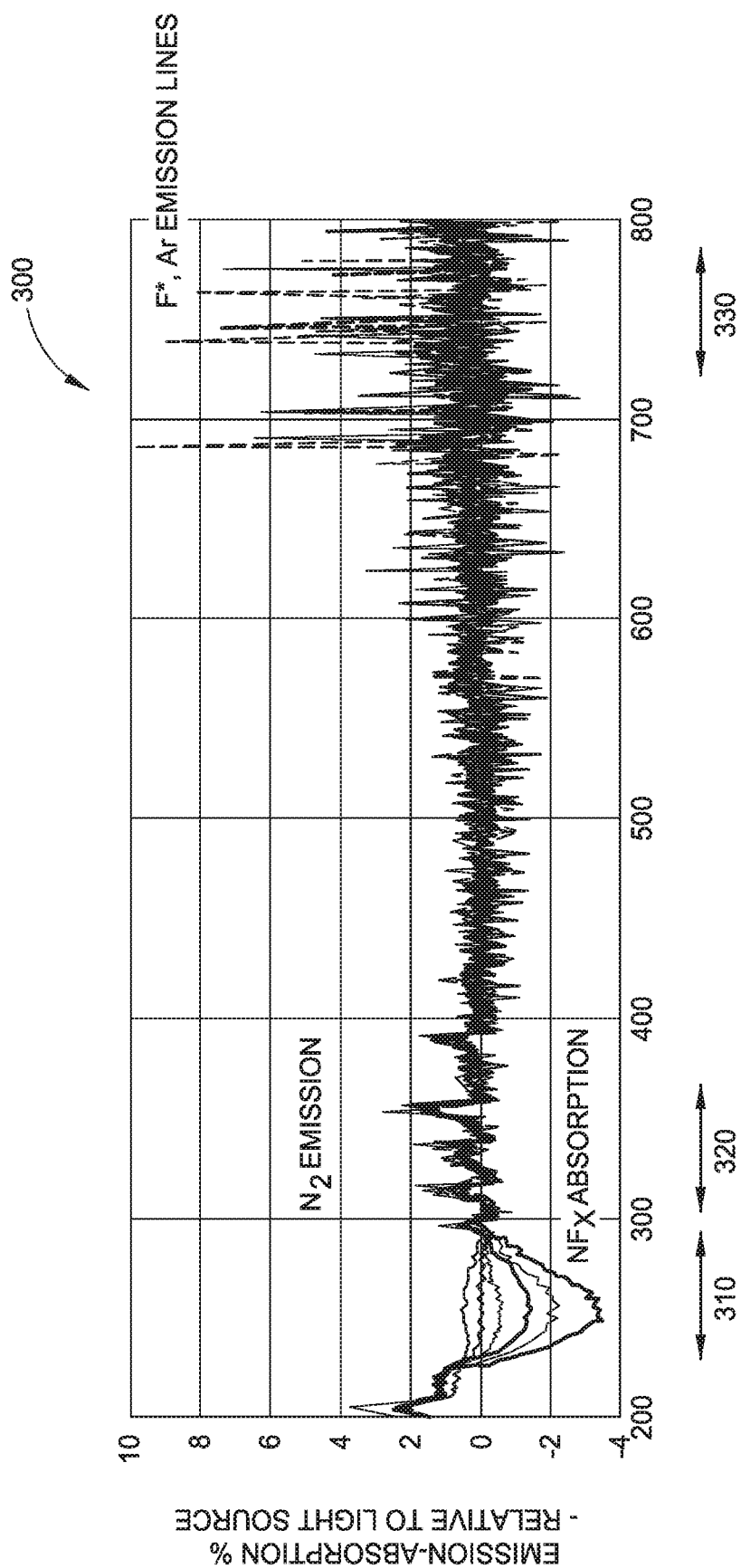
FIG. 3 illustrates a schematic diagram of an exemplary net spectrum according to embodiments disclosed herein.

During operation, the net spectrum of the gas traveling through the conduit 130 may be used to identify the gas species in the process environment of chamber 120. An example net spectrum 300 is illustrated in FIG. 3. This example represents the net spectrum of a gas mixture obtained from an RPS with chemically reactive species including $NF_3$ and AR. The net spectrum includes an absorption spectrum and an emission spectrum: the absorption spectrum includes spectral regions which gas species of interest absorbed from the light beam, and the emission spectrum includes spectral regions that gas species of interest emitted into a spectral measurement volume (e.g., a conduit or a process chamber).

Note that the absorption magnitudes are negative, while emission magnitudes are positive. As illustrated, the portion 310 of the net spectrum 300 between about 230 nm and about 300 nm is indicative of $F_2$. The portion 320 of the net spectrum 300 between about 500 nm and about 560 nm is indicative of NF. The portion 330 of the net spectrum 300 between about 680 nm and about 750 nm is indicative of free F.

The amount of absorption may provide measurement of the number density and/or concentrations of the absorbing species in an optical axis of the investigating light beam. For example, a baseline spectrum may be obtained while no gas of interest is supplied by the reactive species source 110. This may be prior to gas of interest flowing, or it may be as an intermediary step during operations, between periods of gas of interest flow. BLS 140 illuminates the interior of conduit 130, using the configuration of FIG. 1. Light from BLS 140 travels along the optical axis through conduit 130.

Spectrometer 150 receives the radiation that travels through the conduit 130. In some embodiments, spectrometer 150 may analyze the received light to determine a baseline spectrum when little or no reactive species are present in the conduit 130. In some embodiments, spectrometer 150 may convey at least a portion of the received light to sensor array 160 for determining a baseline spectrum. In conjunction with determining a baseline spectrum, an environment spectrum may be obtained. For example, gas may flow from the reactive species source 110 to the chamber 120 through conduit 130, and BLS 140 may illuminate the interior of conduit 130. As described above, the light beam from BLS 140 may travel along an optical axis through conduit 130, and then spectrometer 150 may receive the light beam.

In some embodiments, spectrometer 150 may analyze the received light to determine an environment spectrum. In some embodiments, spectrometer 150 may convey at least a portion of the received light to sensor array 160 for determining an environment spectrum. The baseline spectrum may then be subtracted, for example using a computer or other processing system, from the environment spectrum to compute the net spectrum, which is most representative of absorbance by reactive species.

In some embodiments, the net spectrum may be utilized to produce an estimate of concentrations of the various reactive species in the spectral measurement volume, and thereby in the process chamber. Concentration of a particular species will generally be related linearly to absorption, provided the incident radiation has enough intensity to remain above a depletion level after absorption in the spectral measurement volume. A wavelength or spectrum having a favorable absorption cross-section for a particular species is typically selected, and may be as narrow as needed to differentiate species with similar absorption spectra.

In some embodiments, the net spectrum and/or estimates of concentrations of reactive species may be utilized to control various settings of the semiconductor processing system. For example, when an excess concentration is detected, the reactive species source may be switched to an "off" state, thereby stopping the flow of reactive species to the process chamber. As another example, when a shortage of reactive species is detected, the reactive species source may be switched to an "on" state. In some embodiments, the reactive species source may be switched between the "on" state and the "off" state multiple times during a specific semiconductor processing operation. In some embodiments, reactive species source 110 may also be switched amongst numerous, incremental, "partially on" states. As another example, when insufficient reactive species are available for a desired result, a temperature of the process chamber may be increased to increase the reactivity. Many other setting adjustments may be envisioned that could be controlled in response to the net spectrum measurements and/or estimates of concentrations of reactive species in the spectral measurement volume. In some embodiments, the concentrations of reactive species in the spectral measurement volume 135 are determined to enable feedback and/or control of semiconductor processing in the chamber 120. Therefore, estimation of reactive species concentration may be done during semiconductor processing operations. The process chamber 120 does not need to be taken "off line" to make the OAS measurements. Control settings may be adjusted in "real time" based on the OAS measurements.

Suitable BLS 140 may be characterized by source spectrum stability over time. In some embodiments, a BLS 140 can be used that produces light with intensity variation $$V_i(\tau) = \frac{\int_0^\tau \frac{\partial I(t)}{\partial t} dt}{\int_0^\tau I(t) dt}$$

and/or spectral variation $$V_s(\tau) = \frac{\int_0^\tau \frac{\partial S(\lambda, t)}{\partial t} dt}{\int_0^\tau S(\lambda, t) dt}$$

where S is radiant intensity as a function of wavelength λ and time t, and I is the wavelength integral of S, of less than about 1% over the expected measurement period τ, for example less than about 0.1% variation. As described above, the spectral measurement time may be between 100 msec and 10 sec in a process step with duration of several minutes. In such a process, to measure an absorbance of 0.1% or less, light source variation $V_i(\tau)$ of 0.1% over the light measurement time τ of 0.1 sec is helpful. If the time variation of the spectral intensity of the light source during the detection time of the spectrometer is substantially less than the absorption by reactive species in the conduit or chamber, effect of the spectral variation can be ignored in most cases.

Figure 4:
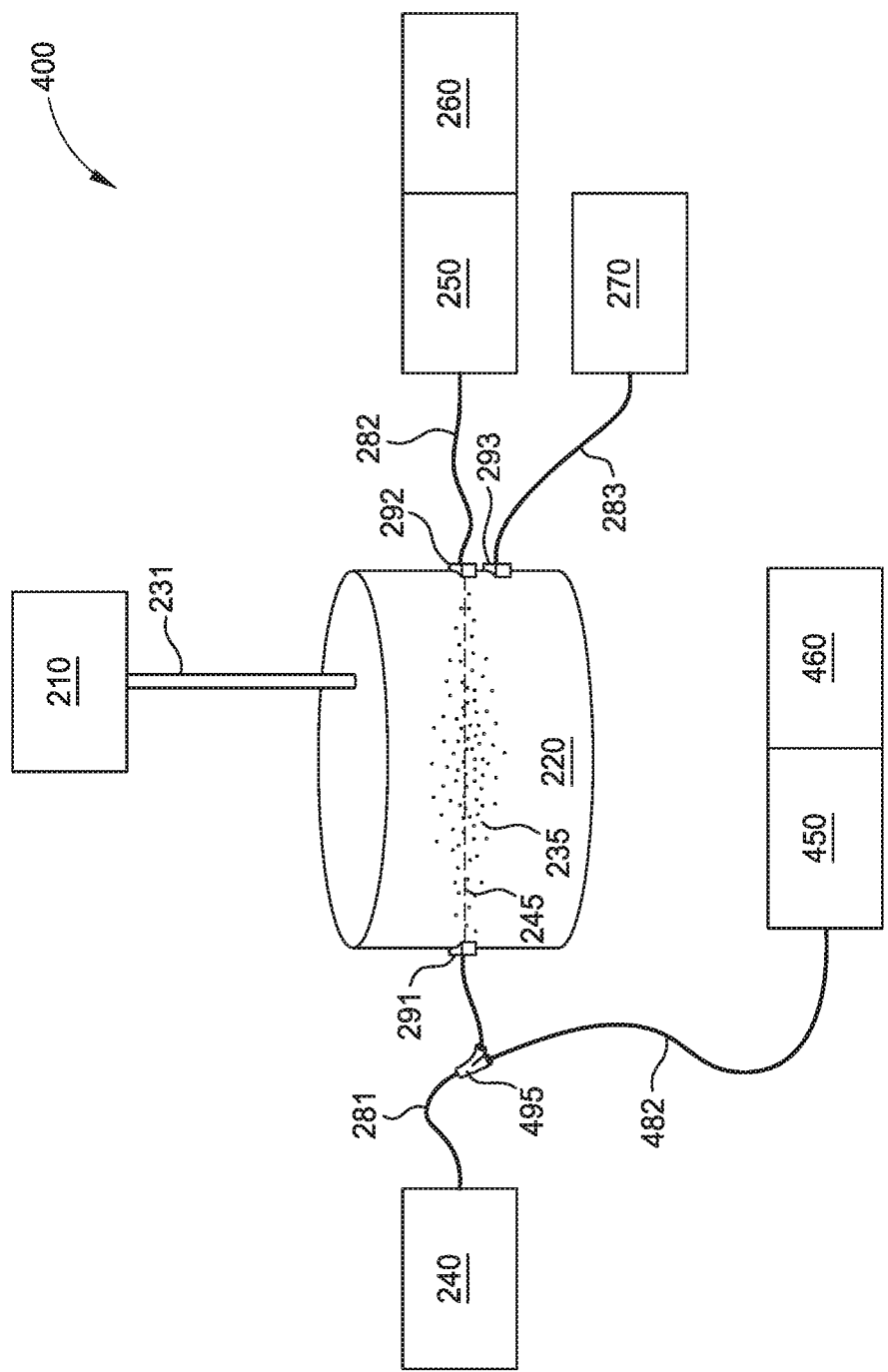
FIG. 4 illustrates a schematic diagram of another exemplary semiconductor processing system according to embodiments disclosed herein.

In some embodiments, the environment spectrum may be normalized by a source spectrum to remove errors related to instability in BLS 140. For example, a source spectrum may be measured at the same time as an environment spectrum. The source spectrum may be from radiation collected from BLS 140 at a point nearer to BLS 140 than spectral measurement volume 135. For example, an optical splitter 495 as illustrated in FIG. 4 may be inserted into optical guide 281 to direct a portion of the radiation emitted by the BLS 240 along a second optical guide 482 to a spectrometer 450, with a sensor array 460, to detect a source spectrum. In some embodiments, the baseline spectrum may be normalized by the source spectrum to yield a baseline absorption spectrum, which can be subtracted from a source-normalized environment spectrum to give a net spectrum. In other embodiments, the source spectrum may be utilized in place of the baseline spectrum. For example, the net spectrum may be created by subtracting the source spectrum from the environment spectrum. In some embodiments, the sensor array 260 has a detection and integration time that is synchronized to the BLS 240 to allow for measurement of the source spectrum and environment spectrum at the same time. Such methods may improve resolution of the absorbance in cases where superior accuracy and precision may be desired.

Scalable, robust OAS systems may be facilitated by spectrometers with high wavelength resolution. For example, some recently developed spectrometers have CCD sensors with high ultraviolet ("UV") sensitivity and dynamic range to measure lower light levels and smaller differences (e.g., about 0.1%) between baseline and environment spectra. It is currently believed that the higher wavelength resolution may enable measurement of various vibrational and rotational states of molecular radical gas, thereby providing state information (e.g., gas temperature, which, in non-equilibrium processing environments, can reach up to 10,000° K).

In some embodiments, fluorescence measurements may be used in conjunction with OAS. Fluorescence radiation is emitted in all directions by fluorescing species. Thus, BLS 140 may both cause a net spectrum along a primary axis (e.g., the optical axis between optical viewport 191 and optical viewport 192) and fluorescence signals off of the primary axis. In some embodiments, Laser Induced Fluorescence ("LIF") may be used to measure very small concentrations of molecules or atoms in a background gas. Embodiments described herein that include a fluorescence detector show the fluorescence detector oriented to detect fluorescence at a location that is not on the optical axis of radiation traveling through the spectral measurement volume to the spectrometer.

In some embodiments, pre-existing semiconductor processing systems may be retrofitted to achieve the benefits of semiconductor processing system 100. For example, a reactive species source of a pre-existing system may be disconnected from its processing chamber. An adapter (e.g., channel 131) may be fitted to the pre-existing reactive species source so that gas flow from the reactive species source may be directed through a conduit 130. An adapter (e.g., channel 132) may also be fitted to the pre-existing chamber so that gas flow from the conduit 130 may flow into the chamber. BLS 140, conduit 130, and spectrometer 150 may be secured and operationally connected (e.g., mechanical, electrical, and data connections) to the pre-existing system. Once retrofitted, gas flow from the reactive species source may be analyzed with the BLS 140, conduit 130, and spectrometer 150, and gas flows may be more precisely managed based on the analysis.

For use as a diagnostic tool in semiconductor processing, absorbance of as little as 0.1-0.01% of incident light should be routinely possible. However, a light beam from a typical light source will generally vary by up to 1% in intensity during processing. The effect of such variation can be minimized by using a light collection or integration time on the spectrometer sensor (and/or CCD) that is of order 100 msec or less. Such spectrometers are available commercially from suppliers such as Verity Instruments, of Austin, Tex. Some such instruments include CCD sensors from Hamamatsu Corp. of Japan. Thus, often an OAS system will include real-time compensation for these variations in the light source emission to reliably detect small absorbance differences associated with the presence and/or concentration differences of reactive species in the processing environment.

Figure 5:
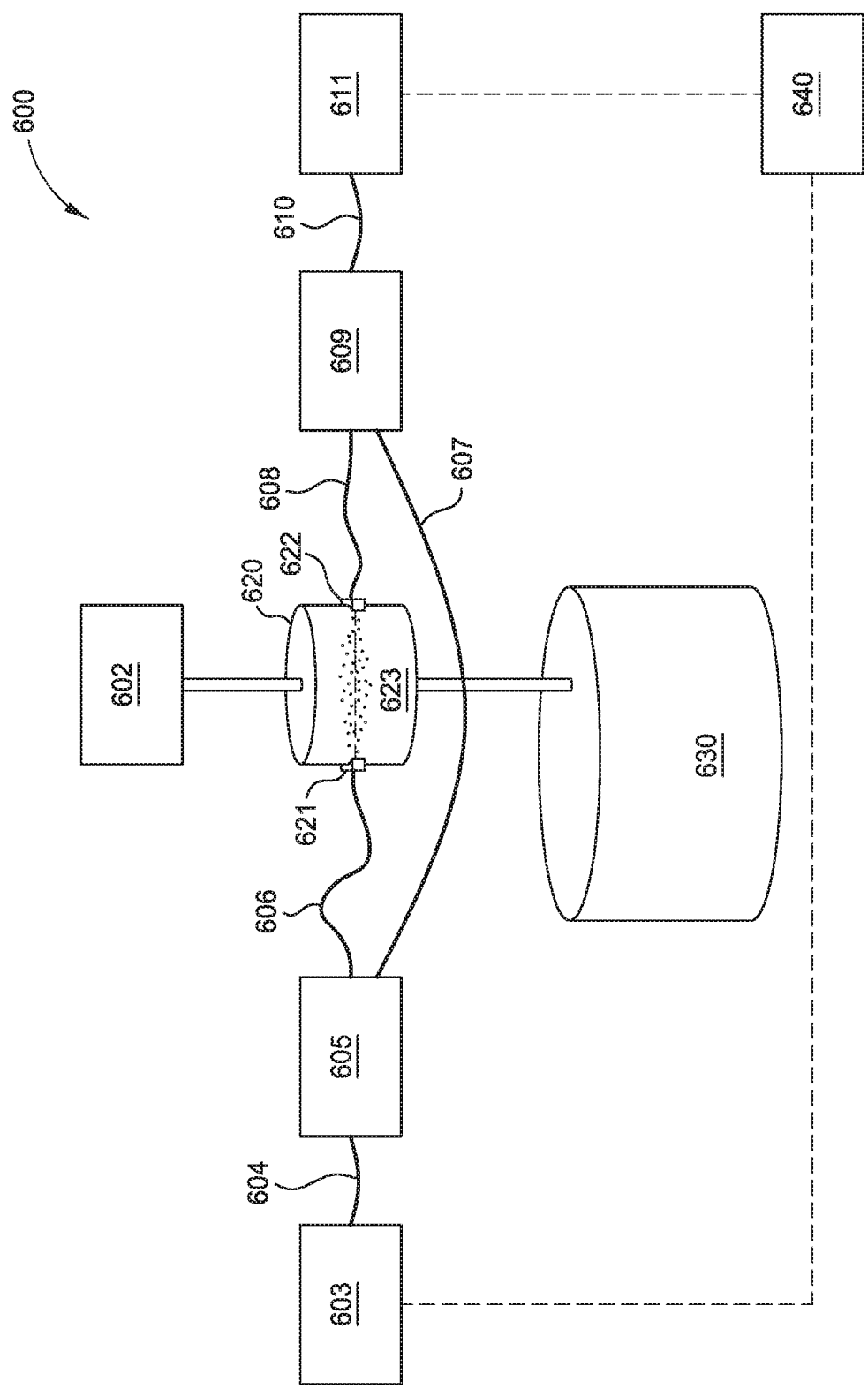
FIG. 5 illustrates an exemplary semiconductor processing system utilizing the OAS capable of compensating in real-time for variations in the light beam emission, according to embodiments disclosed herein.

FIG. 5 illustrates a semiconductor processing system 600 utilizing OAS and capable of compensating in real-time for variations in the BLS emission, according to one embodiment.

As shown, the semiconductor processing system 600 includes a reactive species source 602, a conduit 620 and a chamber 630. The conduit 620 is coupled to OAS components including a BLS 603, an optical splitter 605, an optical combiner 609 and a spectrometer 611. The semiconductor processing system 600 further includes a controller 640.

The reactive species source 602 may be configured to provide an ionized plasma and/or radical gas. The conduit 620 has a spectral measurement volume 623 therein. The BLS 603 emits a light beam, or electromagnetic radiation that can be collimated into a beam, either before or after the optical guide 604. The optical splitter 605 splits the light beam into two representative beams: a probe light beam to propagate across the conduit 620 and interact with reactive species in the spectral measurement volume 623; and a reference light beam that detours around the conduit 620 so that the reference light beam does not interact with reactive species in the conduit 620.

BLS 603 can be optically coupled to the optical splitter 605 through an optical guide 604, and the optical splitter 605 can be optically coupled to the conduit 620 through an optical guide 606 and an optical viewport 621.

The semiconductor processing system 600 optionally includes an optical combiner 609 for receiving the probe light beam and the reference light beam, and outputting a merged beam to the spectrometer 611. In one embodiment, light traversing the spectral measurement volume 623 is carried to the optical combiner 609 through optical guide 608 via viewport 622, while light detouring around the spectral measurement volume 623 travels through optical guide 607. To combine the two, polarizing filters can be included in the optical guides 608 and 609 to polarize the light in the two guides in orthogonal directions. Then, a polarizing beam splitter crystal (PBSC) can be used to combine the two light fields, probe and reference, into one co-propagating light field.

The spectrometer 611 receives the probe light beam to determine an environment spectrum and the reference light beam to determine a baseline spectrum. In some embodiments, the spectrometer 611 is optically coupled to the optical combiner 609 via an optical guide 610. In other embodiments, the spectrometer 611 can be coupled to the conduit 620 and the optical splitter 605 directly without the optical combiner 609 being interposed. That is, the probe light beam and the reference light beam can be provided separately to the spectrometer 611. If the probe and reference light fields have been combined through mutually orthogonal polarization, they can be separated for spectral analysis using a PBSC prior to entering the spectrometer 611.

The spectrometer 611 can include at least two simultaneous processing channels: a first channel for processing the probe light beam, and a second channel for processing the reference light beam. The spectrometer 611 includes a sensor array to obtain a baseline spectrum from the reference light beam and an environment spectrum from the probe light beam.

The semiconductor processing system 600 includes a controller 640 to control processes performed in the process chamber. The controller 640 comprises a central processing unit (CPU), a memory, and various support circuits for the CPU. The controller 640 may be a general-purpose computer that can be used in an industrial setting and be configured by appropriate software for controlling various chambers and sub-processors. The memory stores software (source or object code) that may be executed or invoked to control the overall operations of the semiconductor process chamber 600 in manners described herein. Alternatively, the controller 640 may be implemented, in whole or in part, as special-purpose hardware (application specific circuits). In general, the controller 640 manipulates operations of controllable components in the semiconductor processing system 600 for performing various processes such as deposition or etching. In at least one embodiment, the controller 640 may estimate concentrations of the various reactive species based on the net (absorption and emission) spectrum supplied by spectrometer 611.

Figure 6:
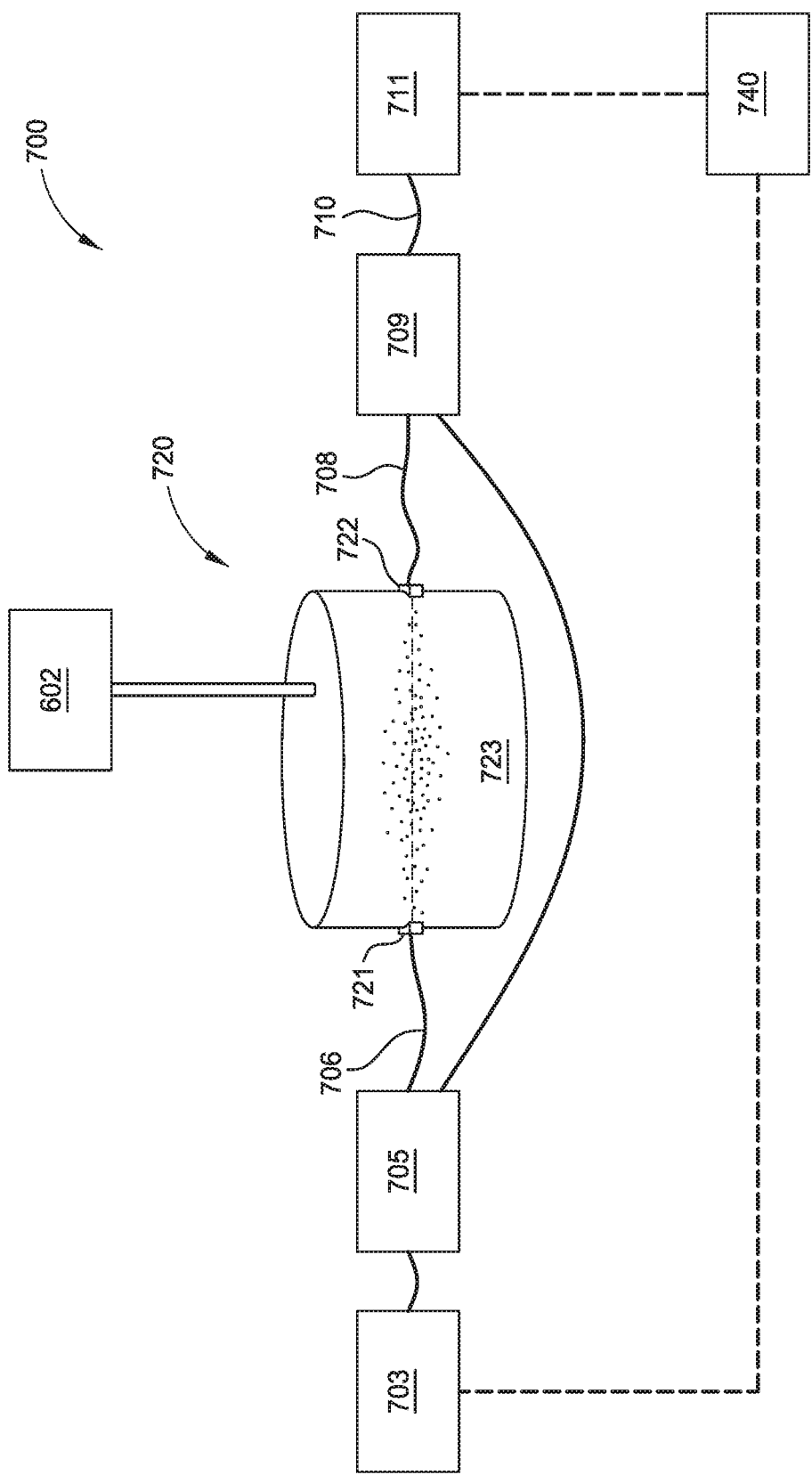
FIG. 6 illustrates another exemplary semiconductor processing system utilizing OAS with a real-time compensation for the variations between a probe light beam and a reference beam, according to embodiments disclosed herein.

In some embodiments, OAS with a real-time compensation for the variations in the light beam emission are implemented using a process chamber as the beam sampled volume/environment instead of passing the light beam through a portion of a conduit leading to the process chamber. FIG. 6 illustrates another semiconductor processing system 700 utilizing OAS with a real-time compensation for light source variations.

The semiconductor processing system 700 may be configured to have split beam paths similar to the semiconductor processing system 600. In FIG. 6, the OAS components are coupled to process chamber 720 having spectral measurement volume 723. In particular, an optical splitter 705 is optically coupled to the process chamber 720 via an optical guide 706 and an optical viewport 721. Optical combiner 709 is optically coupled to the process chamber 720 through an optical viewport 722 and an optical guide 708. The optical combiner 709 is also optically coupled directly to the optical splitter 705 through the optical guide 710.

The optical splitter 705 splits a light beam emitted from BLS 703 into two substantially identical beams: a probing beam that travels through the process chamber 720, and a reference light beam not passing through the process chamber 720. The probe light beam and reference light beam are combined at the optical combiner 709 and then these combined beams are provided to the spectrometer 711.

The spectrometer 711 receives the probe light beam and the reference light beam and determines an environment spectrum and a baseline spectrum from these beams. The spectrometer 711 subtracts the baseline spectrum from the environment spectrum to obtain the net spectrum. The controller 740 may identify types of the gas species and estimate a concentration of these species in the process chamber 720 using the net spectrum.

The total absorbance by the reactive species can be improved by increasing the path length of the probe light beam through process chamber 720. According to the he present disclosure, absorbance signal from the reactive species can be increased by increasing the probe light beam path length by adopting one of arrangements such as multi-pass and ring down schemes in which the probe light beam is reflected back and forth multiple times within the spectral measurement volume.

Figure 7:
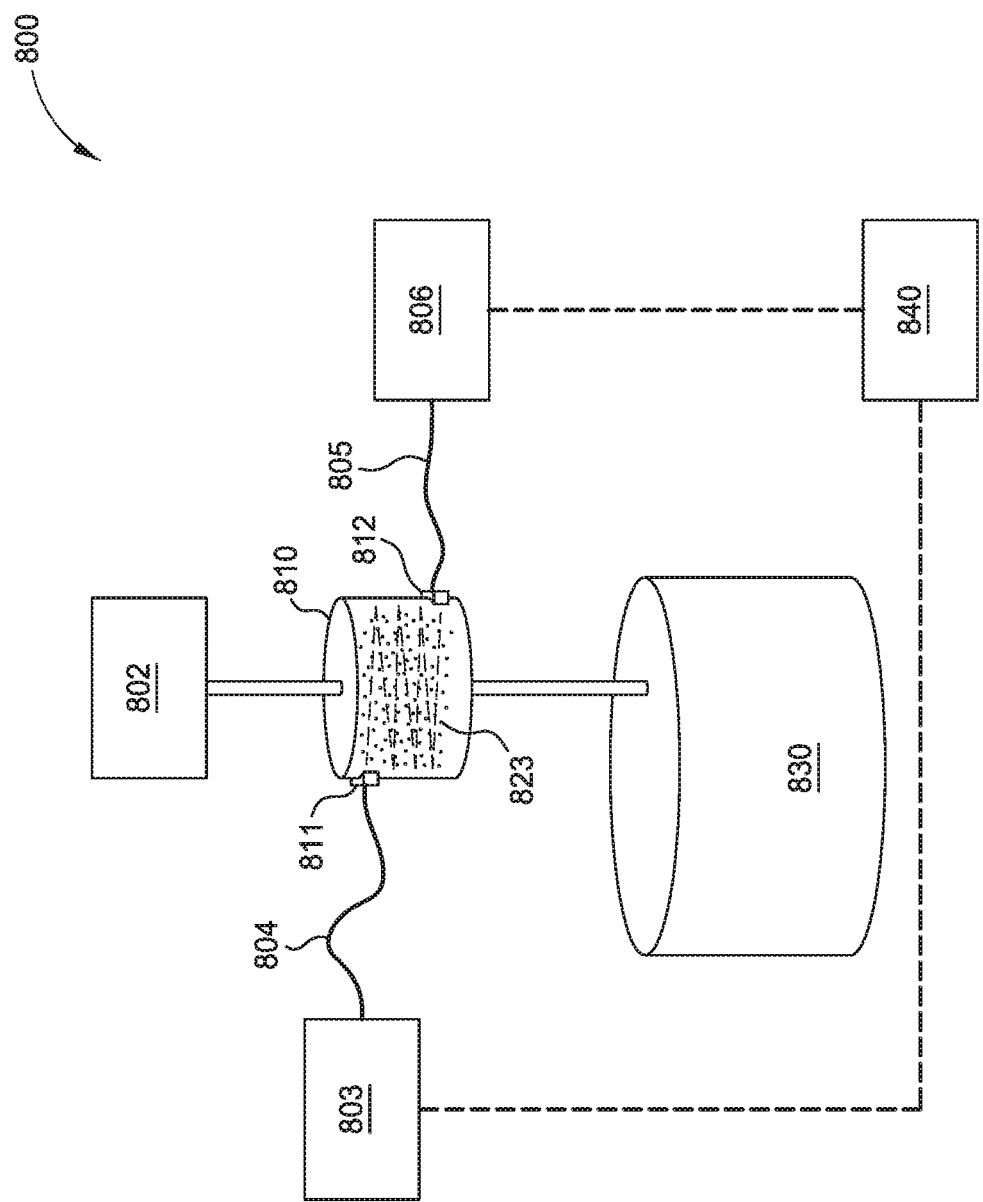
FIG. 7 illustrates a semiconductor processing system utilizing OAS with an extended travel path of a light beam, according to embodiments disclosed herein.
Figure 8:
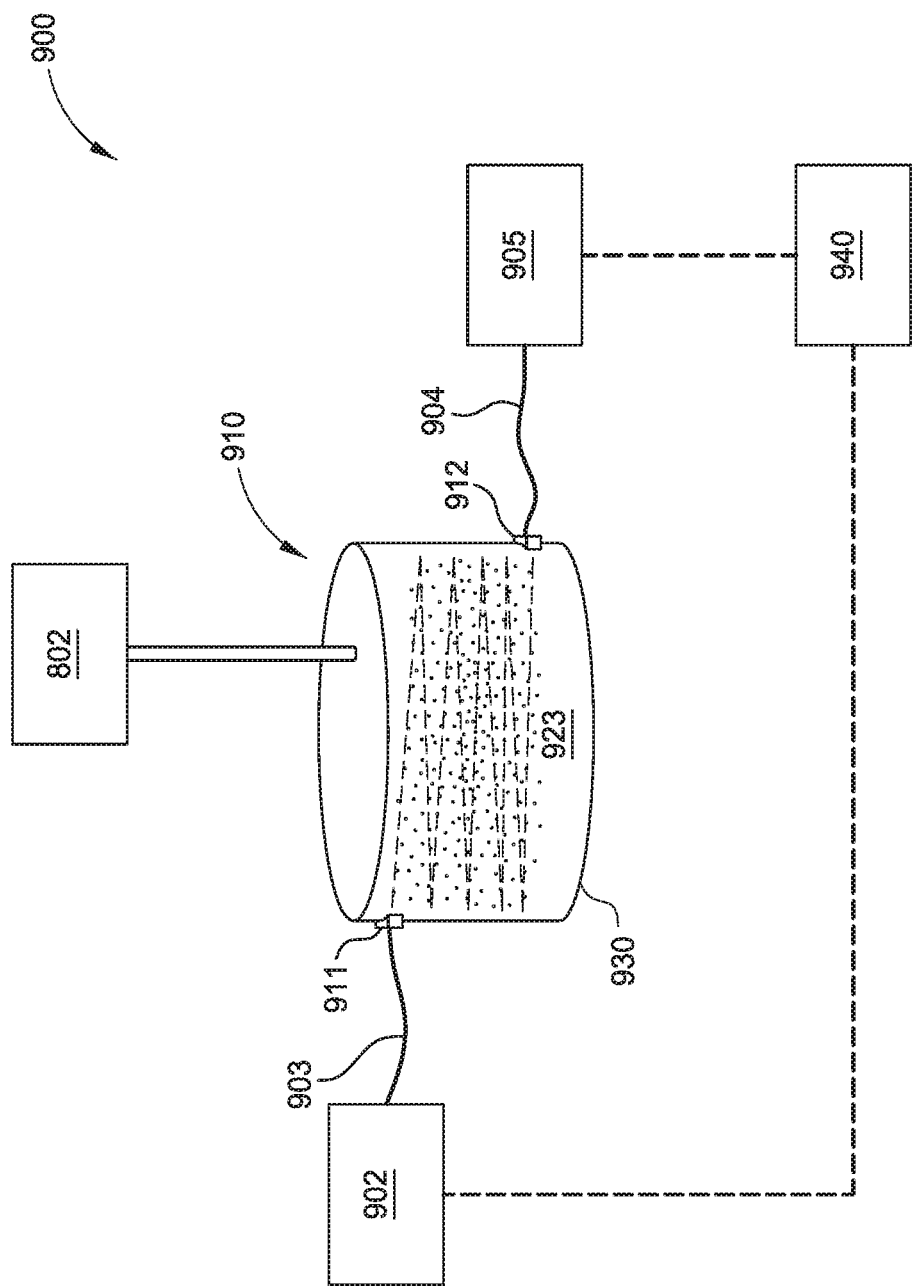
FIG. 8 illustrates an exemplary semiconductor processing system utilizing the OAS with an extended beam path formed in a process chamber having a spectral measurement volume, according to embodiments disclosed herein.

FIG. 7 illustrates a semiconductor processing system 800 utilizing OAS with an extended optical path length within the spectral measurement volume. In FIG. 8, the extended path length of the probe light beam is formed in a spectral measurement volume 823 located in a conduit 810 connected between a reactive species source 802 and a process chamber 830.

The conduit 810 has a reflective inner surface which allows multiple reflections of the light beam within the spectral measurement volume, thus increasing in a total travel distance of the probe light beam. The multiple reflections of the probe light beam inside conduit 810 can be provided by various means. For example, the entire inner surface of the conduit 810 can be polished to a mirrored finish, a highly reflective substance (or substances) can be coated on the inner surface of the conduit 810, and/or various highly reflective or mirrored spots may be particularly disposed and positioned along the inner surface of the conduit 810. In some examples, the light reflective coating or spots can formed using stacked layers of dielectric materials including quartz or sapphire, whereby reflections of the light beam are provided substantially by total internal reflection mechanisms.

As depicted in FIG. 8, the input optical viewport 811 and output optical viewport 812 are disposed at two different positions along the length of the conduit 810 (i.e. at two different distances from the RPS 802). In such a case, the reflective spots can be disposed along the length of the conduit between the two different positions of the optical viewports.

A BLS 803 provides a probe light beam into the conduit 810 via an optical guide 804. The light beam emerges from the optical guide 804 aimed at a reflective spot on a wall of the conduit opposite the optical viewport 811 with an angle of incidence selected to provide reflection of the light beam across the conduit 810 to a reflective spot on the opposite side of the conduit 810. The probe light beam reflects through the spectral measurement volume 823 several times, which increases a total travel distance of the probe light beam within the spectral measurement volume 823. The increased path length within the spectral measurement volume 823 improves the absorbance signal from the reactive species in the spectral measurement volume 823.

The spectrometer 806 is optically coupled to the conduit 810 via optical viewport 812 and optical guide 805. The spectrometer 806 determines a baseline spectrum by receiving the light beam while no reactive species are present in the conduit 810. For example, the baseline spectrum is determined prior to or after the flow of reactive species. The spectrometer 806 also receives a light beam while the reactive species are flowing within the conduit 810 to determine an environment spectrum. Then, the spectrometer 806 subtracts the baseline spectrum from environment spectrum to compute the net spectrum. Subsequently, the controller 840 may identify types of the gas species and estimate concentrations of the reactive species in the process chamber based on the net spectrum.

In one embodiment, the OAS with an extended path length of a light beam described in association with FIG. 7 can be applied to the embodiments having two split light beam paths as described in association with FIGS. 5 and 6.

In some embodiments, the OAS with an extended beam path for improving an absorption signal may be implemented with respect to a process chamber, instead of a conduit. FIG. 8 illustrates a semiconductor processing system 900 utilizing the OAS with an extended beam path formed in a process chamber 910 having a spectral measurement volume 923 according to embodiments disclosed herein.

As illustrated, the process chamber 910 has a reflective inside surface which causes multiple internal reflections for the light beam, thus increasing in a total travel distance of the light beam within the process chamber. The process chamber 910 may have a plurality of reflection spots disposed on the inside surfaces, which the light beam internally reflects from. The plurality of reflection spots may be arranged along the lengthwise direction on opposite inside surfaces of the process chamber 910.

The OAS operation for the semiconductor processing system 900 is performed similarly to the one for the semiconductor processing system 800 except that the multiple internal reflections occur within a process chamber 910, rather than a conduit. The BLS 902 is optically coupled to the process chamber through an optical guide and an optical view point. The BLS 902 emits a light beam into the process chamber 910 via an optical guide 903 and an optical view port 911. The light beam reflects through the spectral measurement volume 923 several times among the reflection spots on the internal surface of the process chamber 910, and exits toward the spectrometer 905 through an optical viewport 912 and an optical guide 904.

The spectrometer 905 receives the light beam from the process chamber 930 via the optical viewport 912 and an optical guide 905 with no reactive species of interest in the process chamber 910 to determine a baseline spectrum. The spectrometer 905 also receives a light beam while the reactive species are flowing in the process chamber 910 to determine an environment spectrum. Then, the spectrometer 905 subtracts the baseline spectrum from environment spectrum to obtain the net spectrum. The controller 940 may identify types of the gas species and estimate concentrations of the reactive species in the process chamber 910 based on the net spectrum.

In one embodiment, the OAS with an extended travel path of a light beam described in association with FIG. 8 can be applied to the embodiments having two split light beam paths as described in association with FIGS. 5 and 6.

Figure 9:
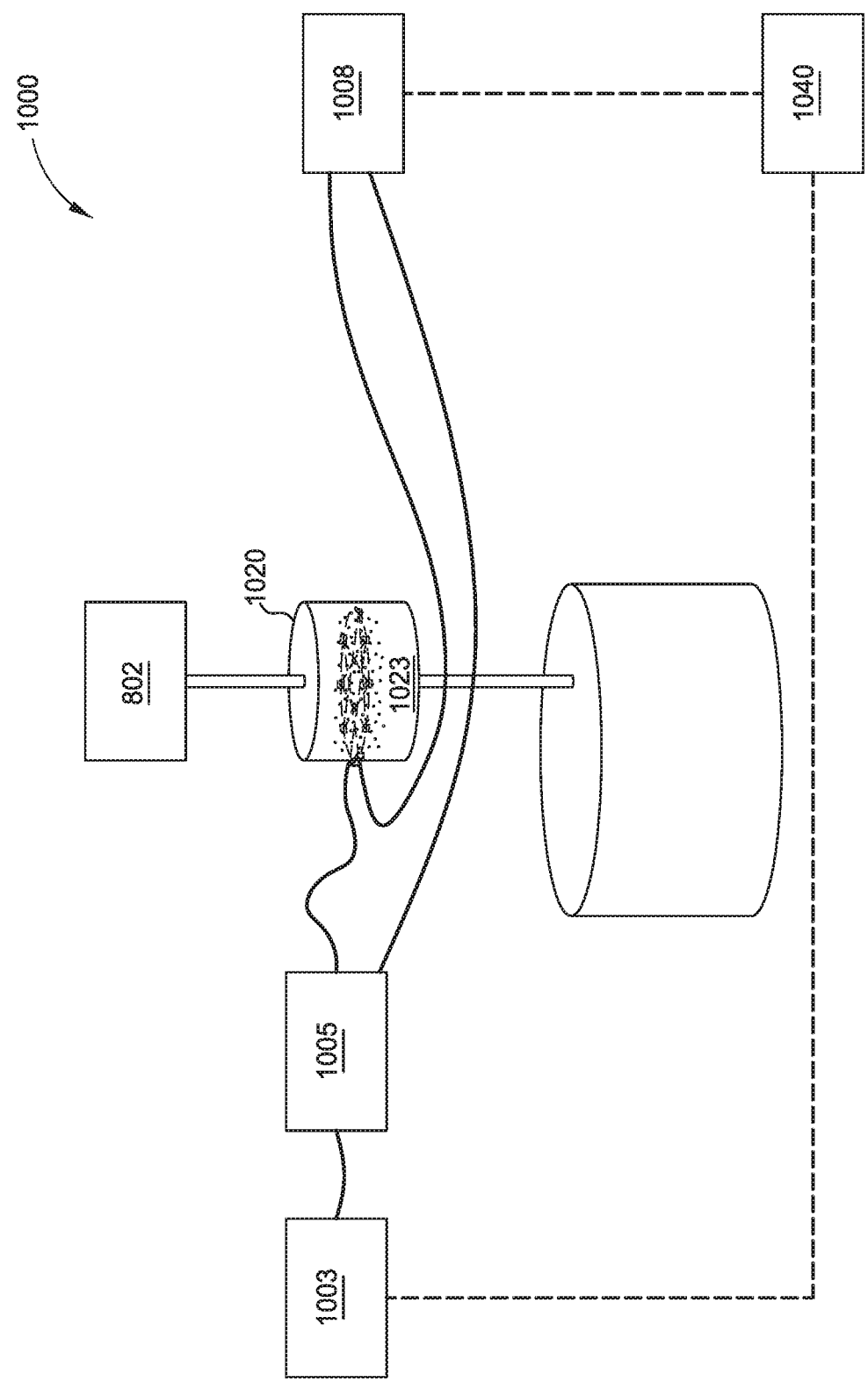
FIG. 9 illustrates an exemplary semiconductor processing system utilizing the OAS with an extended beam light path formed within a conduit having a spectral measurement volume according to embodiments disclosure herein.

FIG. 9 illustrates a semiconductor processing system 1000 utilizing the OAS with an extended beam light path formed within a conduit having a spectral measurement volume 1023 according to embodiments disclosure herein. Here, the plurality of reflection spots are arranged along the radial direction in a non-linear pattern, which may be polygonal, on the side surface of the conduit. Also, the OAS utilizes two split beam paths to reduce or eliminate the variations between a probe light beam and a reference beam as described above in association with FIG. 5.

Similar to the semiconductor processing system 1000, BLS 1003 emits a light beam which is split into a probing beam and a reference light beam by the optical splitter 1005. The probe light beam travels along an optical axis through conduit 1020, and the reference light beam detours around a conduit 1020. Spectrometer 1008 concurrently detects the probe light beam and the reference light beam, and determines an environment spectrum from the probe light beam, and the baseline spectrum from the reference light beam.

The controller 1040 may subtract the baseline spectrum from the environment spectrum to obtain the net spectrum. Then, the controller 1040 may estimate concentrations of the various reactive species in the process chamber based on the net spectrum. The estimated concentrations of reactive species may be utilized to control various settings of the semiconductor processing system 1000.

Figure 10:
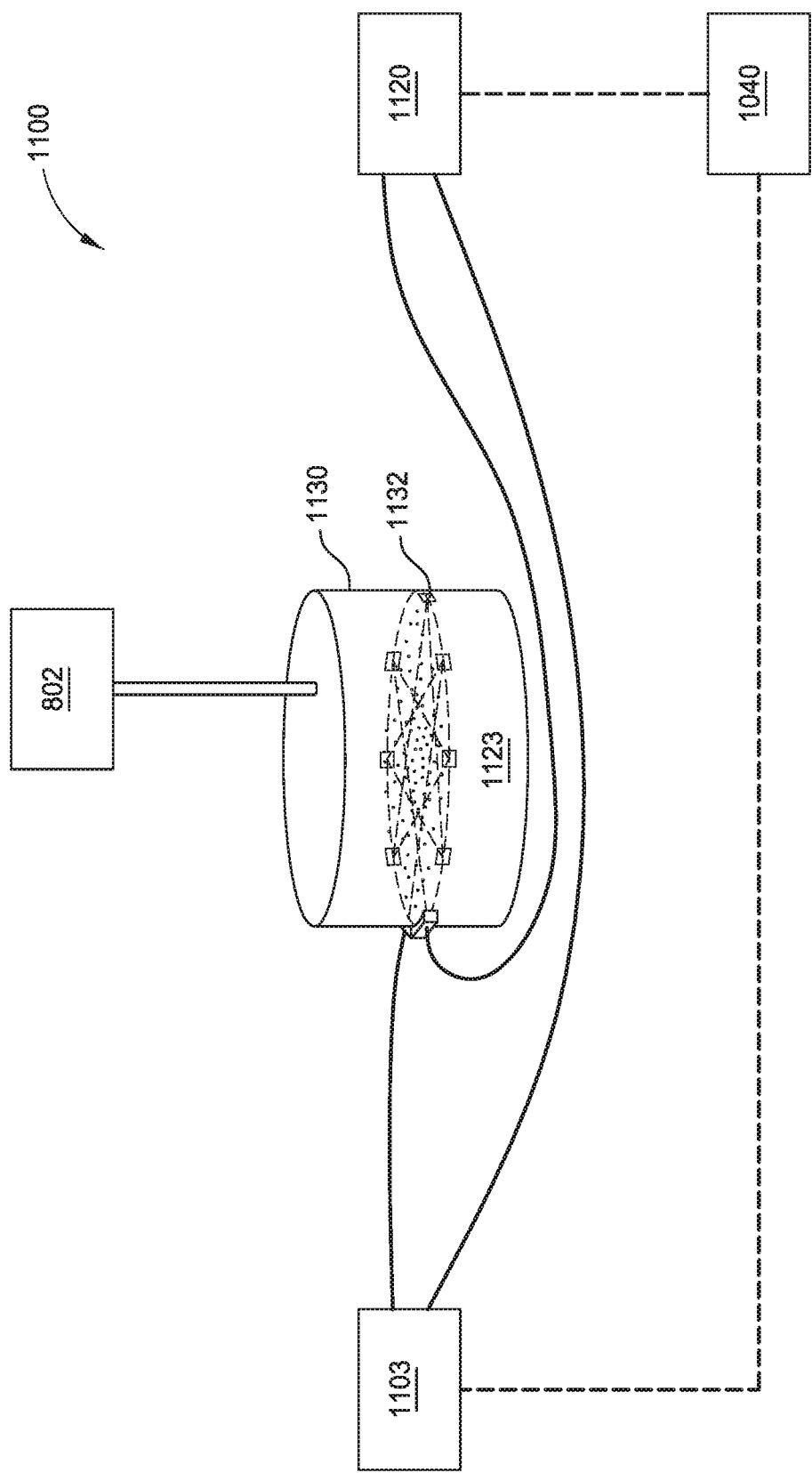
FIG. 10 illustrates another exemplary semiconductor processing system utilizing the OAS with an extended beam light path formed within a process chamber having a spectral measurement volume according to embodiments disclosure herein.

In some embodiments, the OAS with an extended beam light path for increasing the absorption signal may be implemented with respect to a process chamber, instead of a conduit. FIG. 10 illustrates another semiconductor processing system 1100 utilizing the OAS with an extended beam light path from a BLS 1103, through a process chamber 1130 having a spectral measurement volume 1123 to a spectrometer 1120. Here, a plurality of reflection spots 1132 is arranged along the radial direction in a polygonal pattern on the side surfaces of the process chamber 1130. Also, the OAS may utilize two split beam paths to reduce or eliminate the variations between a probe light beam and a reference beam as described above in association with FIG. 6.

While the foregoing is directed to embodiments of the present invention, other and further embodiments of the present disclosure may be devised without departing from the basic scope thereof, and the scope thereof is determined by the claims that follow.

What is claimed is:

1. An apparatus for manufacturing an electronic device, comprising:
    a reactive species source;
    a spectral measurement volume fluidly coupled to the reactive species source, wherein the spectral measurement volume is defined by a side wall having a plurality of reflection spots disposed thereon, wherein the plurality of reflection spots are arranged radially in a non-linear pattern on the side wall;
    a light source optically coupled to the spectral measurement volume to emit a light beam into the spectral measurement volume;
    a spectrometer optically coupled to the spectral measurement volume to receive light from the spectral measurement volume; and
    a controller configured to:
        when a reactive species is present in the spectral measurement volume, control the light source to emit the light beam into the spectral measurement volume and the spectrometer to determine an environment spectrum using the received light, and
        when the reactive species is not present in the spectral measurement volume, control the light source to emit the light beam into the spectral measurement volume and the spectrometer to determine a baseline spectrum using the received light;
        calculate a net spectrum based on a difference between the environment spectrum and the baseline spectrum; and
    estimate a concentration of the reactive species based on the net spectrum.

2. The apparatus of claim 1, wherein the spectral measurement volume is optically coupled to the light source though an optical guide, the optical guide coupled between the light source and a conduit, a first optical port coupled to the conduit and to the spectrometer through an optical guide coupled between the spectrometer and the conduit, and a second optical port coupled to the conduit.

3. The apparatus of claim 1, wherein the net spectrum represents an absorption spectrum defined by a spectrum absorbed by the reactive species and an emission spectrum defined by a spectrum emitted by the reactive species.

4. The apparatus of claim 1, wherein the spectrometer has a light collection time between 10 msec and 1 sec.

5. The apparatus of claim 4, wherein the light source has a spectral variation, during the light collection time, of 0.1% or less.

6. The apparatus of claim 1, wherein a light beam entering the spectral measurement volume undergoes multiple internal reflections among the plurality of reflections spots.

7. The apparatus of claim 6, wherein the plurality of reflection spots are formed from a transparent material that includes quartz or sapphire, and wherein reflections of the light beam are substantially total internal reflections.

8. The apparatus of claim 1, further comprising a semiconductor process chamber and a conduit fluidly coupled between the reactive species source and the semiconductor process chamber, wherein the spectral measurement volume is located within the process chamber.

9. The apparatus of claim 1, further comprising a semiconductor process chamber and a conduit fluidly coupled between the reactive species source and the semiconductor process chamber, wherein the spectral measurement volume is located within the conduit.

10. An apparatus for manufacturing a semiconductor device, comprising:
    a reactive species source;
    a spectral measurement volume fluidly coupled to the reactive species source, wherein the spectral measurement volume is defined by a side wall having a plurality of reflection spots disposed thereon, wherein the plurality of reflection spots are arranged radially in a non-linear pattern on the side wall;
    a light source optically coupled to the spectral measurement volume to emit a light beam into the spectral measurement volume;
    a beam splitter optically coupled to the light source to split the light beam into a probe light beam to be transmitted through the spectral measurement volume, and a reference light beam to be transmitted around the spectral measurement volume;
    a spectrometer optically coupled to the spectral measurement volume to concurrently receive the probe light beam to generate an environment spectrum and the reference light beam to generate a baseline spectrum; and
    a controller configured to:
        calculate a net spectrum based on a difference between the environment spectrum and the baseline spectrum; and
        estimate a concentration of a reactive species based on the net spectrum.

11. The apparatus of claim 10, wherein the spectrometer includes a first channel configured to detect the probe light beam, and a second channel to detect the reference light beam.

12. The apparatus of claim 10, wherein the probe light beam is transmitted through a conduit, and the reference light beam is detoured around the conduit.

13. The apparatus of claim 10, wherein the beam splitter is optically coupled to a conduit through a first optical guide and a first optical port to transmit the probe light beam, and the beam splitter is optically coupled to the spectrometer through a second optical guide, and a second optical port is optically coupled to the conduit to transmit the reference light beam.

14. The apparatus of claim 10, wherein a light beam entering the spectral measurement volume undergoes multiple internal reflections among the plurality of reflections spots.

15. The apparatus of claim 10, further comprising a semiconductor process chamber and a conduit fluidly coupled between the reactive species source and the semiconductor process chamber, wherein the spectral measurement volume is located within the process chamber.

16. The apparatus of claim 10, further comprising a semiconductor process chamber and a conduit fluidly coupled between the reactive species source and the semiconductor process chamber, wherein the spectral measurement volume is located within the conduit.

17. A method of estimating a gas concentration in a semiconductor processing chamber, the method comprising:
    transmitting a first light beam through a spectral measurement volume containing a reactive species;
    extending a light beam path of the first light beam through the spectral measurement volume in a non-linear pattern by a plurality of reflection spots on a side wall of the spectral measurement volume;

transmitting a second light beam that does not encounter the reactive species;

receiving, by a spectrometer, the first light beam and the second light beam from;

determining, using the spectrometer, a baseline spectrum from the second light beam and an environment spectrum from the first light beam;

calculating a net spectrum based on a difference between the environment spectrum and the baseline spectrum; and estimating a concentration of the reactive species in the spectral measurement volume based on the net spectrum.

18. The method of claim 17, wherein the second light beam is transmitted through the spectral measurement volume when the reactive species is not present in the spectral measurement volume.

19. The method of claim 17, further comprising:
emitting, by a light source, a light beam; and
splitting the beam light into the first light beam and the second light beam, wherein the second light beam is detoured around the spectral measurement volume.

20. The method of claim 17, further comprising delivering the reactive species from a reactive species source to a semiconductor process chamber through a conduit and wherein the spectral measurement volume is located within the conduit.

* * * * *